(12) United States Patent
Redgrave et al.

(10) Patent No.: US 7,804,730 B2
(45) Date of Patent: *Sep. 28, 2010

(54) METHOD AND APPARATUS FOR ACCESSING CONTENTS OF MEMORY CELLS

(75) Inventors: Jason Redgrave, Mountain View, CA (US); Herman Schmit, Palo Alto, CA (US)

(73) Assignee: Tabula, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/745,442

(22) Filed: May 7, 2007

(65) Prior Publication Data

US 2007/0242529 A1    Oct. 18, 2007

Related U.S. Application Data

(63) Continuation of application No. 11/081,870, filed on Mar. 15, 2005, now Pat. No. 7,230,869.

(51) Int. Cl.
*G11C 7/00* (2006.01)
*G11C 11/00* (2006.01)
*G11C 7/10* (2006.01)

(52) U.S. Cl. .................. 365/222; 365/154; 365/189.04

(58) Field of Classification Search ............ 365/189.01, 365/222

See application file for complete search history.

(56) References Cited

U.S. PATENT DOCUMENTS

| | | | |
|---|---|---|---|
| 4,873,459 A | | 10/1989 | El Gamal et al. |
| 5,150,326 A | * | 9/1992 | Aoki ..................... 365/189.16 |
| 5,245,575 A | * | 9/1993 | Sasaki et al. ........... 365/189.12 |
| 5,270,581 A | | 12/1993 | Nakamura |
| 5,325,329 A | * | 6/1994 | Inoue et al. ............ 365/189.05 |

(Continued)

FOREIGN PATENT DOCUMENTS

WO  PCT/US2008/010526    12/2008
WO  WO 2009/035586       3/2009

OTHER PUBLICATIONS

Trimberger, S., "Effects of FPGA Architecture on FPGA Routing," *32nd ACM/IEEE Design Automation Conference*, Jun. 1995, ACM.
Notice of Allowance of U.S. Appl. No. 11/081,874, filed May 8, 2007, Redgrave, Jason.

(Continued)

*Primary Examiner*—Son L Mai
(74) *Attorney, Agent, or Firm*—Adeli & Tollen, LLP

(57) ABSTRACT

The invention relates to accessing contents of memory cells. Some embodiments include a memory structure that has a first cell, a second cell, and a sense amplifier. The first cell stores a first value. The first and second cells are connected to the sense amplifier by one or more bit lines. The sense amplifier receives the first value stored by the first cell by using the one or more bit lines and drives the received first value to the second cell through the one or more bit lines. The receiving and driving occur in a single clock cycle. In some embodiments, the second cell outputs the first value. The memory structure of some embodiments also includes a third cell connected to the sense amplifier by the one or more bit lines. The sense amplifier drives a second value to the third cell while the second cell outputs the first value. Other embodiments include a method for accessing data in a memory structure. The method receives a value stored by a first cell; and drives the received value to a second cell. The receiving and driving occur in a single time period. In some embodiments, the method also includes driving a first value to the second cell in a first time period and driving a second value to a third cell in a second time period. In these embodiments, the second cell outputs the first value during the second time period and the third cell outputs the second value during a third time period.

10 Claims, 6 Drawing Sheets

U.S. PATENT DOCUMENTS

| | | |
|---|---|---|
| 5,329,498 A | 7/1994 | Greenstein |
| 5,349,250 A | 9/1994 | New |
| 5,357,153 A | 10/1994 | Chiang et al. |
| 5,365,125 A | 11/1994 | Goetting et al. |
| 5,369,622 A | 11/1994 | McLaury |
| 5,371,708 A * | 12/1994 | Kobayashi .................. 365/221 |
| 5,426,378 A | 6/1995 | Ong |
| 5,521,835 A | 5/1996 | Trimberger |
| 5,532,958 A * | 7/1996 | Jiang et al. ................. 365/154 |
| 5,544,078 A * | 8/1996 | Podkowa .................... 702/178 |
| 5,552,721 A | 9/1996 | Gould |
| 5,581,500 A | 12/1996 | D'Souza |
| 5,600,263 A | 2/1997 | Trimberger et al. |
| 5,610,829 A | 3/1997 | Trimberger |
| 5,629,637 A | 5/1997 | Trimberger et al. |
| 5,631,578 A | 5/1997 | Clinton et al. |
| 5,640,106 A | 6/1997 | Erickson et al. |
| 5,646,544 A | 7/1997 | Iadanza |
| 5,646,545 A | 7/1997 | Trimberger et al. |
| 5,659,484 A | 8/1997 | Bennett et al. |
| 5,682,107 A | 10/1997 | Tavana et al. |
| 5,692,147 A | 11/1997 | Larsen et al. |
| 5,694,057 A | 12/1997 | Gould |
| 5,701,441 A | 12/1997 | Trimberger |
| 5,719,889 A | 2/1998 | Iadanza |
| 5,721,498 A | 2/1998 | Mason et al. |
| 5,732,246 A | 3/1998 | Gould et al. |
| 5,734,622 A | 3/1998 | Furumochi et al. |
| 5,737,235 A | 4/1998 | Kean et al. |
| 5,745,422 A | 4/1998 | Iadanza |
| 5,745,734 A | 4/1998 | Craft et al. |
| 5,760,602 A | 6/1998 | Tan |
| 5,761,483 A | 6/1998 | Trimberger |
| 5,764,954 A | 6/1998 | Fuller et al. |
| 5,768,178 A * | 6/1998 | McLaury .................... 365/149 |
| 5,777,360 A | 7/1998 | Rostoker et al. |
| 5,802,003 A | 9/1998 | Iadanza et al. |
| 5,815,726 A | 9/1998 | Cliff |
| 5,825,662 A | 10/1998 | Trimberger |
| 5,847,577 A | 12/1998 | Trimberger |
| 5,889,411 A | 3/1999 | Chaudhary |
| 5,914,616 A | 6/1999 | Young et al. |
| 5,914,906 A | 6/1999 | Iadanza et al. |
| 5,940,603 A | 8/1999 | Huang |
| 5,944,813 A | 8/1999 | Trimberger |
| 5,970,240 A | 10/1999 | Chen et al. |
| 5,982,655 A | 11/1999 | Doyle |
| 5,991,191 A | 11/1999 | Rao |
| 6,002,991 A | 12/1999 | Conn, Jr. |
| 6,023,421 A | 2/2000 | Clinton et al. |
| 6,038,192 A | 3/2000 | Clinton et al. |
| 6,044,031 A | 3/2000 | Iadanza et al. |
| 6,054,873 A | 4/2000 | Laramie |
| 6,057,707 A | 5/2000 | Schleicher et al. |
| 6,069,490 A | 5/2000 | Ochotta et al. |
| 6,075,745 A | 6/2000 | Gould et al. |
| 6,084,429 A | 7/2000 | Trimberger |
| 6,086,631 A | 7/2000 | Chaudhary et al. |
| 6,091,263 A | 7/2000 | New et al. |
| 6,091,645 A | 7/2000 | Iadanza |
| 6,107,821 A | 8/2000 | Kelem et al. |
| 6,110,223 A | 8/2000 | Southgate et al. |
| 6,111,779 A | 8/2000 | You |
| 6,118,707 A | 9/2000 | Gould et al. |
| 6,130,854 A | 10/2000 | Gould et al. |
| 6,134,154 A | 10/2000 | Iwaki et al. |
| 6,140,839 A | 10/2000 | Kaviani et al. |
| 6,150,838 A | 11/2000 | Wittig et al. |
| 6,163,168 A | 12/2000 | Nguyen et al. |
| 6,166,946 A * | 12/2000 | Naffziger .................... 365/154 |
| 6,172,521 B1 | 1/2001 | Motomura |
| 6,173,379 B1 * | 1/2001 | Poplingher et al. .......... 711/165 |
| 6,175,247 B1 | 1/2001 | Scalera et al. |
| 6,184,707 B1 | 2/2001 | Norman et al. |
| 6,184,709 B1 | 2/2001 | New |
| 6,204,687 B1 | 3/2001 | Schultz et al. |
| 6,205,076 B1 | 3/2001 | Wakayama et al. |
| 6,229,337 B1 | 5/2001 | Xiao et al. |
| 6,233,191 B1 | 5/2001 | Gould et al. |
| 6,255,849 B1 | 7/2001 | Mohan |
| 6,275,064 B1 | 8/2001 | Agrawal et al. |
| 6,292,019 B1 | 9/2001 | New et al. |
| 6,326,651 B1 | 12/2001 | Manabe |
| 6,326,807 B1 | 12/2001 | Veenstra et al. |
| 6,346,824 B1 | 2/2002 | New |
| 6,348,813 B1 | 2/2002 | Agrawal et al. |
| 6,381,732 B1 | 4/2002 | Burnham et al. |
| 6,404,224 B1 | 6/2002 | Azegami et al. |
| 6,411,128 B2 | 6/2002 | Maeda |
| 6,414,880 B1 * | 7/2002 | Yabe et al. ............. 365/189.05 |
| 6,430,736 B1 | 8/2002 | Levi et al. |
| 6,469,540 B2 | 10/2002 | Nakaya |
| 6,469,553 B1 | 10/2002 | Sung et al. |
| 6,480,954 B2 | 11/2002 | Trimberger |
| 6,487,709 B1 | 11/2002 | Keller et al. |
| 6,490,707 B1 | 12/2002 | Baxter |
| 6,496,041 B2 | 12/2002 | Hirairi |
| 6,496,918 B1 | 12/2002 | Dehon et al. |
| 6,501,698 B1 * | 12/2002 | Mobley ..................... 365/221 |
| 6,515,505 B1 | 2/2003 | Rees |
| 6,515,509 B1 | 2/2003 | Baxter |
| 6,526,559 B2 | 2/2003 | Schiefele et al. |
| 6,529,040 B1 | 3/2003 | Carberry et al. |
| 6,545,501 B1 | 4/2003 | Bailis et al. |
| 6,560,139 B2 | 5/2003 | Ma et al. |
| 6,593,771 B2 | 7/2003 | Bailis et al. |
| 6,601,227 B1 | 7/2003 | Trimberger |
| 6,603,330 B1 | 8/2003 | Snyder |
| 6,629,308 B1 | 9/2003 | Baxter |
| 6,636,070 B1 | 10/2003 | Altaf |
| 6,642,744 B2 | 11/2003 | Or-Bach et al. |
| 6,643,173 B2 | 11/2003 | Takemura |
| 6,650,142 B1 | 11/2003 | Agrawal et al. |
| 6,667,635 B1 | 12/2003 | Pi et al. |
| 6,668,361 B2 | 12/2003 | Bailis et al. |
| 6,675,309 B1 | 1/2004 | Baxter |
| 6,686,769 B1 | 2/2004 | Nguyen et al. |
| 6,703,861 B2 | 3/2004 | Ting |
| 6,714,041 B1 | 3/2004 | Darling et al. |
| 6,717,436 B2 | 4/2004 | Kress et al. |
| 6,724,648 B2 | 4/2004 | Khellah et al. |
| 6,732,068 B2 | 5/2004 | Sample et al. |
| 6,798,688 B2 | 9/2004 | Joshi |
| 6,806,730 B2 | 10/2004 | Bailis et al. |
| 6,809,979 B1 | 10/2004 | Tang |
| 6,829,756 B1 | 12/2004 | Trimberger |
| 6,831,479 B2 | 12/2004 | Lo |
| 6,838,902 B1 | 1/2005 | Elftmann et al. |
| 6,894,527 B1 | 5/2005 | Donlin et al. |
| 6,903,962 B2 | 6/2005 | Nii |
| 6,911,842 B1 | 6/2005 | Ghia et al. |
| 6,920,627 B2 | 7/2005 | Blodget et al. |
| 6,924,663 B2 | 8/2005 | Masui et al. |
| 6,925,025 B2 | 8/2005 | Deng et al. |
| 6,937,172 B1 | 8/2005 | Lowe et al. |
| 6,937,535 B2 | 8/2005 | Ahn et al. |
| 6,956,399 B1 | 10/2005 | Bauer |
| 6,970,374 B2 | 11/2005 | Lin |
| 6,992,505 B1 | 1/2006 | Zhou |
| 6,998,872 B1 | 2/2006 | Chirania et al. |
| 7,010,667 B2 | 3/2006 | Vorbach et al. |
| 7,027,346 B2 | 4/2006 | Houston et al. |
| 7,028,281 B1 | 4/2006 | Agrawal et al. |
| 7,030,651 B2 | 4/2006 | Madurawe |

| | | |
|---|---|---|
| 7,061,941 B1 | 6/2006 | Zheng |
| 7,064,577 B1 | 6/2006 | Lee |
| 7,075,333 B1 | 7/2006 | Chaudhary et al. |
| 7,088,136 B1 | 8/2006 | Lewis |
| 7,107,568 B2 | 9/2006 | Cronquist |
| 7,109,752 B1 | 9/2006 | Schmit et al. |
| 7,110,317 B2 | 9/2006 | Song et al. |
| 7,112,992 B1 | 9/2006 | Guzman et al. |
| 7,113,421 B2 | 9/2006 | Maeda et al. |
| 7,116,131 B1 | 10/2006 | Chirania et al. |
| 7,126,372 B2 | 10/2006 | Vadi et al. |
| 7,126,856 B2 | 10/2006 | Sun et al. |
| 7,129,746 B1 | 10/2006 | Balasubramanian et al. |
| 7,135,886 B2 | 11/2006 | Schlacter |
| 7,136,308 B2 * | 11/2006 | Kant et al. ............. 365/189.16 |
| 7,138,827 B1 | 11/2006 | Trimberger |
| 7,143,329 B1 | 11/2006 | Trimberger et al. |
| 7,145,829 B1 * | 12/2006 | Kim et al. .................... 365/222 |
| 7,154,299 B2 | 12/2006 | Swami et al. |
| 7,167,025 B1 | 1/2007 | Schmit et al. |
| 7,193,440 B1 | 3/2007 | Schmit et al. |
| 7,200,235 B1 | 4/2007 | Trimberger |
| 7,203,100 B2 * | 4/2007 | Kant et al. ............. 365/185.14 |
| 7,209,404 B2 | 4/2007 | Chen et al. |
| 7,212,448 B1 | 5/2007 | Trimberger |
| 7,218,137 B2 | 5/2007 | Vadi et al. |
| 7,230,869 B1 * | 6/2007 | Redgrave et al. ............ 365/222 |
| 7,268,586 B1 | 9/2007 | Redgrave |
| 7,272,031 B1 | 9/2007 | Redgrave |
| 7,304,904 B2 * | 12/2007 | Lambrache et al. ......... 365/205 |
| 7,310,757 B2 | 12/2007 | Ngo et al. |
| 7,325,179 B2 | 1/2008 | Sasakura |
| 7,328,384 B1 | 2/2008 | Kulkarni et al. |
| 7,330,050 B2 | 2/2008 | Redgrave |
| 7,417,918 B1 | 8/2008 | Hao et al. |
| 7,424,655 B1 | 9/2008 | Trimberger |
| 7,425,841 B2 | 9/2008 | Schmit et al. |
| 7,492,187 B2 | 2/2009 | Kamp et al. |
| 7,525,835 B2 | 4/2009 | Redgrave |
| 7,529,992 B1 | 5/2009 | Teig et al. |
| 7,532,030 B2 | 5/2009 | Redgrave |
| 7,535,252 B1 | 5/2009 | Teig et al. |
| 7,570,077 B2 | 8/2009 | Redgrave |
| 7,610,566 B1 | 10/2009 | Caldwell et al. |
| 7,616,027 B2 | 11/2009 | Schmit et al. |
| 2001/0007428 A1 | 7/2001 | Young et al. |
| 2001/0013797 A1 | 8/2001 | Hirairi |
| 2001/0038552 A1 | 11/2001 | Ishimaru |
| 2002/0008541 A1 | 1/2002 | Young et al. |
| 2002/0010853 A1 | 1/2002 | Trimberger et al. |
| 2002/0049955 A1 | 4/2002 | Yamashita et al. |
| 2002/0113619 A1 | 8/2002 | Wong |
| 2002/0125910 A1 | 9/2002 | New et al. |
| 2002/0125914 A1 | 9/2002 | Kim |
| 2002/0157071 A1 | 10/2002 | Schiefele et al. |
| 2002/0161568 A1 | 10/2002 | Sample et al. |
| 2002/0163357 A1 | 11/2002 | Ting |
| 2003/0042931 A1 | 3/2003 | Ting |
| 2003/0080777 A1 | 5/2003 | Baxter |
| 2003/0101419 A1 | 5/2003 | Yamashita et al. |
| 2003/0110430 A1 | 6/2003 | Bailis et al. |
| 2003/0122578 A1 | 7/2003 | Masui et al. |
| 2004/0010767 A1 | 1/2004 | Agrawal et al. |
| 2004/0103265 A1 | 5/2004 | Smith |
| 2004/0105207 A1 | 6/2004 | Spaderna et al. |
| 2004/0196066 A1 | 10/2004 | Ting |
| 2004/0222817 A1 | 11/2004 | Madurawe |
| 2004/0233758 A1 | 11/2004 | Kim et al. |
| 2005/0128789 A1 | 6/2005 | Houston |
| 2005/0134308 A1 | 6/2005 | Okada et al. |
| 2005/0254315 A1 | 11/2005 | Salters |
| 2006/0158217 A1 | 7/2006 | Madurawe |
| 2006/0250168 A1 | 11/2006 | Starr et al. |
| 2007/0143577 A1 | 6/2007 | Smith |
| 2007/0241791 A1 | 10/2007 | Schmit et al. |
| 2007/0286008 A1 | 12/2007 | Redgrave |
| 2009/0058461 A1 | 3/2009 | Schmit et al. |
| 2009/0146686 A1 | 6/2009 | Voogel et al. |
| 2010/0007376 A1 | 1/2010 | Redgrave |

OTHER PUBLICATIONS

Final Office Action of U.S. Appl. No. 11/081,874, filed Nov. 27, 2006, Redgrave, Jason.

Non-Final Office Action of U.S. Appl. No. 11/081,874, filed Apr. 19, 2006, Redgrave, Jason.

Non-Final Office Action of U.S. Appl. No. 11/845,028, filed Jan. 24, 2008, Redgrave, Jason.

Notice of Allowance of U.S. Appl. No. 11/081,870, filed Jan. 26, 2007, Redgrave, Jason, et al.

Final Office Action of U.S. Appl. No. 11/081,870, filed Oct. 6, 2006, Redgrave, Jason, et al.

Non-Final Office Action of U.S. Appl. No. 11/081,870, filed May 9, 2006, Redgrave, Jason, et al.

"Design for Low Power in Actel Antifuse FPGAs", Actel Application Note, 2000 Actel Corporation, Sep. 2000, pp. 1-8.

Gayasen, A., et al., "Reducing Leakage Energy in FPGAs Using Region-Constrained Placement," *FPGA '04*, Feb. 22-24, 2004, pp. 51-58, ACM, Monterey, California, USA.

U.S. Appl. No. 12/685,673, filed Jan. 11, 2010, Schmit, Herman, et al.

U.S. Appl. No. 12/685,676, filed Jan. 11, 2010, Teig, Steven, et al.

Updated portions of prosecution history of U.S. Appl. No. 10/883,486, filed Aug. 4, 2008, Schmit, Herman, et al., now issued U.S Patent 7,425,841.

Updated portions of prosecution history of U.S. Appl. No. 12/200,867, filed Nov. 30, 2009, Schmit, Herman, et al.

Updated portions of prosecution history of U.S. Appl. No. 10/882,946, filed Sep. 28, 2006, Schmit, Herman, et al., now issued U.S Patent 7,193,440.

Updated portions of prosecution history of U.S. Appl. No. 11/617,671, filed Jun. 23, 2009, Schmit, Herman, et al., now issued U.S Patent 7,616,027.

Updated portions of prosecution history of U.S. Appl. No. 10/883,051, filed Sep. 7, 2006, Schmit, Herman, et al., now issued U.S. Patent 7,167,025.

Updated portions of prosecution history of U.S. Appl. No. 11/608,790, filed Sep. 30, 2009, Schmit, Herman, et al.

Updated portions of prosecution history of U.S. Appl. No. 11/081,874, filed Feb. 27, 2007, Redgrave, Jason, now issued U.S. Patent 7,272,031.

Updated portions of prosecution history of U.S. Appl. No. 11/845,028, filed Dec. 15, 2008, Redgrave, Jason, now issued U.S. Patent 7,525,835.

Updated portions of prosecution history of U.S. Appl. No. 11/081,870, filed Jan. 3, 2007, Redgrave, Jason, et al., now issued U.S. Patent 7,230,869.

Updated portions of prosecution history of U.S. Appl. No. 11/082,230, filed Jun. 29, 2007, Redgrave, Jason, now issued U.S. Patent 7,268,586.

Updated portions of prosecution history of U.S. Appl. No. 11/781,224, filed Dec. 30, 2008, Redgrave, Jason, now issued U.S. Patent 7,532,030.

Updated portions of prosecution history of U.S. Appl. No. 11/082,203, filed Dec. 6, 2007, Redgrave, Jason, now issued U.S. Patent 7,330,050.

Updated portions of prosecution history of U.S. Appl. No. 11/963,771, filed Mar. 20, 2009, Redgrave, Jason, now issued U.S. Patent 7,570,077.

Updated portions of prosecution history of U.S. Appl. No. 12/498,356, filed Sep. 24, 2009, Redgrave, Jason.

Updated portions of prosecution history of U.S. Appl. No. 11/390,973, filed Mar. 23, 2009, Teig, Steven, et al., now issued U.S. Patent 7,529,992.

Updated portions of prosecution history of U.S. Appl. No. 11/391,000, filed Sep. 29, 2009, Teig, Steven, et al.

Updated portions of prosecution history of U.S. Appl. No. 11/754,262, filed Jul. 25, 2008, Redgrave, Jason, et al.

Updated portions of prosecution history of U.S. Appl. No. 11/754,263, filed Jan. 5, 2009, Teig, Steven, et al., now issued U.S. Patent 7,535,252.

Updated portions of prosecution history of U.S. Appl. No. 11/754,264, filed Jun. 11, 2009, Caldwell, Andrew, et al., now issued U.S. Patent 7,610,566.

Hauck, S., et al., "Totem: Domain-Specific Reconfigurable Logic," *IEEE Transactions on VLSI Systems*, 2006 Month N/A, pp. 1-25.

Mandal, C., et al., "Use of Multi-port Memories in Programmable Structures for Architectural Synthesis", *Proceedings of 8th Annual IEEE International Innovative Systems in Silicon*, Oct. 9-11, 1996, pp. 341-351.

Markovskiy, Y., et al., "Analysis of Quasi-Static Scheduling Techniques in a Virtualized Reconfigurable Machine," *FPGA '02*, Feb. 24-26, 2002, ACM, Monterey, California, USA.

Master, P., "The Next Big Leap in Reconfigurable Systems," *A Technology Vision Whitepaper*, Apr. 28, 2004 but © 2003, pp. 1-8, QuickSilver Technology, Inc., San Jose, California.

Mathstar, Inc., "MathStar FPOA Architecture: A New Approach to High Throughput, Scalable, and Reprogrammable Design," *Technology Overview*, 2003 Month N/A, MathStar, Inc.

Mirsky, E., et al., "Matrix: A Reconfigurable Computing Architecture with Configurable Instruction Distribution and Deployable Resources," *Proceedings of the IEEE Workshop on FPGAs for Custom Computing Machines*, Apr. 1996.

Mirsky, E., et al., "Matrix: A Reconfigurable Computing Device with Configurable Instruction Distribution and Deployable Resources (Extended Abstract)," *Hot Chips Symposium 1997*, Aug. 1997.

Morris, K., "Lattice Launches XP: Non-Volatility at the Forefront of FPGA," *FPGA and Programmable Logic Journal*, Mar. 1, 2005, pp. 1-5, Techfocus Media, Inc.

Morris, K., "Rationalizing Reconfigurability: The Importance of Being Programmable," *FPGA and Structured ASIC Journal*, Sep. 27, 2005.

Nelson, B.E., "Reconfigurable Computing: An Introduction and Overview," Sep. 23, 1998, pp. 1-43.

Ochotta, E.S., et al., "A Novel Predictable Segmented FPGA Routing Architecture," *FPGA 98*, Feb. 1998, pp. 3-11, ACM, Monterey, CA, USA.

Ohkura, J., et al., "Dataflow in the Adaptive Computing Machine (ACM)," *A Technology Application Whitepaper*, Apr. 28, 2004 but © 2003, pp. 1-9, QuickSilver Technology, Inc., San Jose, California.

Parhami, B., "Part IV: Low-Diameter Architectures," *ECE 2548*: Advanced Computer Architecture: Parallel Processing, UCSB, Spring 2005 Month N/A, slides 1-93, Behrooz Parhami, Santa Barbara, California, USA.

Patel, C., et al., "An Architectural Exploration of Via Patterned Gate Arrays," *Proceedings of the 2003 International Symposium on Physical Design*, Apr. 6-9, 2003, pp. 184-189, Monterey, California, USA.

Pedram, M., "IEEE Circuits and Systems Society Distinguished Lecturer Program," NPL Date Unknown.

Pedram, M., et al., "A New Design for Double Edge Triggered Flip-flops", Feb. 10-13 1998.

Perissakis, S., et al., "Embedded DRAM for a Reconfigurable Array," *Proceedings of the 1999 Symposium on VLSI Circuits*, Jun. 1999, slides 1-24.

Perissakis, S., et al., "Embedded DRAM for a Reconfigurable Array," *Proceedings of the 1999 Symposium on VLSI Circuits*, Jun. 1999.

Plunkett, B., "In Search of the SDR Holy Grail," *A Technology Application Whitepaper*, Apr. 28, 2004 but © 2003, pp. 1-7, QuickSilver Technology, Inc., San Jose, California.

Plunkett, B., et al., "Adapt2400 ACM Architecture Overview," *A Technology Whitepaper*, 2004 Month N/A, pp. 1-9, QuickSilver Technology, Inc.

Quicklogic Corp., "Ultra-Low Power FPGA Combining Performance, Density, and Embedded RAM", *Eclipse II Family Data Sheet*, Nov. 2005, pp. 1-92, QuickLogic Corporation, US.

Quicksilver Technology, Inc., "Adapt2000 ACM System Platform," Apr. 2004, pp. 1-39, QuickSilver Technology, Inc., San Jose, California.

Quicksilver Technology, Inc., "InSpire SDK Tool Set," *Product Brief*, 2004 Month N/A, QuickSilver Technology, Inc., San Jose, California, USA.

Quicksilver Technology, Inc., "QS2412 Adaptive Computing Machine," *Product Brief*, 2004 Month N/A, QuickSilver Technology, Inc., San Jose, California, USA.

Rahman, A., et al., "Wiring Requirement and Three-Dimensional Integration Technology for Field Programmable Gate Arrays," *IEEE Transactions on Very Large Scale Integration (VLSI) Systems*, Feb. 2003, pp. 44-54, vol. 11, No. 1, IEEE.

Rose, J., "Hard vs. Soft: The Central Question of Pre-Fabricated Silicon," *34th International Symposium on Multiple-Valued Logic (ISMVL '04)*, May 2004, pp. 2-5.

Sambhwani, S., et al., "Implementing W-CDMA Transceiver Structure on an Adaptive Computing Platform," *A Technology Application Whitepaper*, Apr. 28, 2004 but © 2003, pp. 1-12, QuickSilver Technology, Inc., San Jose, California.

Scalera, S.M., et al., "A Mathematical Benefit Analysis of Context Switching Reconfigurable Computing," *Proceedings of the 5th Reconfigurable Architectures Workshop (RAW)*, Mar. 30, 1998, vol. 1388 of *Lecture Notes in Computer Science*, pp. 73-78.

Schaumont, P., et al., "A Quick Safari Through the Reconfiguration Jungle," *38th Design Automation Conference*, Jun. 2001, pp. 172-177, Las Vegas, Nevada, USA.

Schmit, H., "Extra-Dimensional Island-Style FPGAs," *Field Programmable Logic and Application (FPL 2003)*, Sep. 2003, pp. 406-415.

Schmit, H., "Extra-dimensional Island-Style FPGAs," *Field Programmable Logic and Application (FPL 2003)*, Sep. 2003, slides 1-26.

Schmit, H., "Incremental Reconfiguration for Pipelined Applications," *Proceedings of the 5th IEEE Symposium on FPGA-Based Custom Computing Machines*, Apr. 16-18 1997.

Schmit, H., et al., "FPGA Switch Block Layout and Evaluation," *FPGA '02*, Feb. 24-26, 2002, ACM, Monterey, California, USA.

Schmit, H., et al., "PipeRench: A Virtualized Programmable Datapath in 0.18 Micron Technology," *Proceedings of the IEEE 2002 Custom Integrated Circuits Conference*, May 12-15, 2002, pp. 63-66.

Schmit, H., et al., "Queue Machines: Hardware Compilation in Hardware," *Proceedings of the 10th Annual IEEE Symposium on Field-Programmable Custom Computing Machines*, Apr. 22-24, 2002.

Sharma, A., et al., "Accelerating FPGA Routing Using Architecture-Adaptive A* Techniques," *Proceedings of the IEEE Conference on Field-Programmable Technology 2005*, Dec. 11-14, 2005.

Singh, A., et al., "Interconnect Pipelining in a Throughput-Intensive FPGA Architecture," *FPGA 2001*, Feb. 11-13, 2001, pp. 153-160, ACM, Monterey, CA, USA.

Singh, A., et al., "PITIA: An FPGA for Throughput-Intensive Applications," *IEEE Transactions on Very Large Scale Integration (VLSI) Systems*, Jun. 2003, pp. 354-363, vol. 11, No. 3, IEEE.

Slade, A.L., et al., "Reconfigurable Computing Application Frameworks," *11th Annual IEEE Symposium on Field-Programmable Custom Computer Machines*, Apr. 9-11, 2003.

Snider, G., "Performance-Constrained Pipelining of Software Loops onto Reconfigurable Hardware," *FPGA '02*, Feb. 24-26, 2002, pp. 177-186, ACM, Monterey, California, USA.

Soviani, et al., "Optimizing Sequential Cycles through Shannon Decomposition and Retiming", *Design, Automation, and Test in Europe*, Mar. 10, 2006, pp. 1085-1090.

Tau, E., et al., "A First Generation DPGA Implementation," *Proceedings of the Third Canadian Workshop on Field-Programmable Devices*, May 1995, pp. 138-143.

Tau, E., et al., "Transit Note #114: A First Generation DPGA Implementation," *M.I.T. Transit Project*, Jan. 1995, pp. 1-8.

Taylor, R., et al., "Enabling Energy Efficiency in Via-Patterned Gate Array Devices", *Proceedings of the 41st annual conference on Design automation*, Jun. 7-11, 2004, San Diego, California, USA.

Teifel, J., et al., "Highly Pipelined Asynchronous FPGAs," *Proceedings of the 2004 ACM/SIGDA 12th International Symposium on Field Programmable Gate Arrays*, Feb. 22-24, 2004, ACM, Monterey, California, USA.

Tessier, R., et al., "Balancing Logic Utilization and Area Efficiency in FPGAs," *Proceedings of the Roadmap to Reconfigurable Computing*,

*10th International Workshop on Field Programmable Logic and Applications*, Aug. 27-30, 2000, pp. 535-544.

Tom, M., et al., "Clustering of Large Designs for Channel-Width Constrained FPGAs," *University of British Columbia, Department of Electrical and Computer Engineering*, Jun. 2005, slides 1-39, Vancouver, British Columbia, Canada.

Tom, M., et al., "Logic Block Clustering of Large Designs for Channel-Width Constrained FPGAs" *DAC 2005*, Jun. 13-17, 2005, pp. 726-731, ACM, Anaheim, California, USA.

Tong, K.T., et al., "Regular Logic Fabrics for a Via Patterned Gate Array (VPGA)," *Proceedings of the IEEE 2003 Custom Integrated Circuits Conference 2003*, Sep. 21-24, 2003.

Tsu, W., et al., "HSRA: High-Speed, Hierarchical Synchronous Reconfigurable Array," *Proceedings of the International Symposium on Field Programmable Gate Arrays*, Feb. 1999, pp. 69-78.

Wawrzynek, J., "EECS150-Digital Design: Lecture 5—Field Programmable Gate Arrays (FPGAs)," Feb. 4, 2002, slides 1-20.

Weaver, N., et al., "The SFRA: A Corner-Turn FPGA Architecture," *FPGA '04*, Feb. 22-24, 2004, ACM, Monterey, California, USA.

Wilton, S.J.E., "Memory-to-Memory Connection Structures in FPGAs with Embedded Memory Arrays," *FPGA 97*, Feb. 1997, pp. 10-16, ACM, Monterey, California, USA.

Xilinx, Inc., "Virtex-4 Family Overview," *Advance Product Specification*, Sep. 10, 2004, pp. 21-30, v1.1, Xilinx, Inc.

Zhang, M., et al., "Design of Soft Error Tolerant Logic Circuits," *Ming Zhang, University of Illinois at Urbana-Champaign*, 2005, 2005, pp. 1-23.

Zilic, Z. et al., "Using BDDs to Design ULMs for FPGAs," *Proceedings of the 1996 ACM Fourth International Symposium on Field-Programmable Gate Arrays (FPGA '96)*, Feb. 11-13, 1996, pp. 1-10, Monterey, California, USA.

Zuchowski, P.S., "A Hybrid ASIC and FPGA Architecture," 2002 Month N/A, IEEE.

U.S. Appl. No. 11/391,000, filed Mar. 27, 2006, Teig, Steven, et al.

U.S. Appl. No. 11/754,262, filed May 25, 2007, Redgrave, Jason, et al.

U.S. Appl. No. 12/498,356, filed Jul. 6, 2009, Redgrave, Jason.

Published application of commonly owned U.S. Appl. No. 11/608,790.

Published application of commonly owned U.S. Appl. No. 12/200,867.

Issued Patent of commonly owned U.S. Appl. No. 10/883,276.
Issued Patent of commonly owned U.S. Appl. No. 10/883,051.
Issued Patent of commonly owned U.S. Appl. No. 10/882,946.
Issued Patent of commonly owned U.S. Appl. No. 11/082,230.
Issued Patent of commonly owned U.S. Appl. No. 11/082,203.
Issued Patent of commonly owned U.S. Appl. No. 10/883,486.
Issued Patent of commonly owned U.S. Appl. No. 11/845,028.
Issued Patent of commonly owned U.S. Appl. No. 11/390,973.
Issued Patent of commonly owned U.S. Appl. No. 11/781,224.
Issued Patent of commonly owned U.S. Appl. No. 11/754,263.
Issued Patent of commonly owned U.S. Appl. No. 11/963,771.
Issued Patent of commonly owned U.S. Appl. No. 11/754,264.
Issued Patent of commonly owned U.S. Appl. No. 11/617,671.

"§3 Programmable Logic Devices," *Digital System Design*, 2001 Month N/A, slides 3.1-3.28.

"The Xilinx Virtex Series FPGA," Jan. 22, 2001, slides 1-22.

"Unifying Sequential and Spatial Computing with a Single Instruction Set Architecture," *ISCA '04*, Jun. 19-23, 2004, ACM, Munchen, Oberbayern, Germany.

Agrawal, O., et al., "An Innovative, Segmented High Performance FPGA Family with Variable-Grain-Architecture and Wide-gating Functions," *FPGA 99*, Feb. 1999, pp. 17-26, ACM, Monterey, CA, USA.

Ahmed, E., et al., "The Effect of LUT and Cluster Size on Deep-Submicron FPGA Performance and Density," *FPGA 2000*, Feb. 2000, ACM, Monterey, CA, USA.

Altera Corp., "6. DSP Blocks in Stratix II Devices," *SII52006-1.0*, Feb. 2004, pp. 1-32.

Altera, "Stratix II DSP Performance," *White Paper*, Feb. 2004, pp. 1-9, ver. 1.0, Altera Corporation, San Jose, CA.

Amerson, R., et al., "Plasma: An FPGA for Million Gate Systems," *Proceedings of the 1996 ACM 4th International Symposium on FPGAs*, Feb. 11-13, 1996, pp. 10-16, Monterey, California, USA.

Backus, J., "Can Programming be Liberated from the Von Neumann Style? A Functional Style and its Algebra of Programs," *Communications of the ACM*, Aug. 1978, pp. 613-641, vol. 21, No. 8, ACM.

Barker, R., "QuickSilver ACM SilverStream Design Methodology with the Inspire SDK Tool Set," *A Technology Application Whitepaper*, Jan. 26, 2004, pp. 1-8, QuickSilver Technology, Inc., San Jose, California.

Butts, M., "Future Directions of Dynamically Reprogrammable Systems," *IEEE 1995 Custom Integrated Circuits Conference*, May 1995, pp. 487-494, IEEE.

Camposano, R., "The Growing Semiconductor Zoo: ASICs, CSSP, ASSP, ASIP, Structured Arrays, FPGAs, Processor Arrays, Platforms . . . and Other Animalia," Aug. 29, 2003, pp. 1-74, Synopsys, Inc.

Caspi, E., et al., "A Streaming Multi-Threaded Model," *MSP-3*, Dec. 2, 2001, pp. 1-23.

Caspi, E., et al., "Stream Computations Organized for Reconfigurable Execution (SCORE): Introduction and Tutorial," Aug. 25, 2000, pp. 1-31, Version 1.0.

Compton, K., et al., "An Introduction to Reconfigurable Computing," *IEEE Computer*, Apr. 2000.

Compton, K., et al., "Reconfigurable Computing: A Survey of Systems and Software," *ACM Computing Surveys*, Jun. 2002, pp. 171-210, vol. 34, No. 2, ACM, New York, NY.

Cong, J., et al., "Combinational Logic Synthesis for LUT Based Field Programmable Gate Arrays," *ACM Transactions on Design Automation of Electronic Systems*, Apr. 1996, pp. 145-204, vol. 1, No. 2, ACM, Inc.

Davare, A., et al., "The Best of Both Worlds: The Efficient Asynchronous Implementation of Synchronous Specifications," *DAC '04*, Jun. 7-11, 2004, ACM, San Diego, California, USA.

Dehon, A., "Balancing Interconnect and Computation in a Reconfigurable Computing Array (or, why don't you really want 100% LUT utilization)," *Proceedings of the International Symposium on Field Programmable Gate Arrays*, Feb. 1999, 10 pages.

Dehon, A., "DPGA Utilization and Application," *Proceedings of the 1996 ACM Fourth International Symposium on Field-Programmable Gate Arrays FPGA*, Feb. 11-13, 1996, Monterey, California, USA.

Dehon, A., "Dynamically Programmable Gate Arrays: A Step Toward Increased Computational Density," *Proceedings of the Fourth Canadian Workshop on Field-Programmable Devices*, May 1996, pp. 47-54.

Dehon, A., "Reconfigurable Architectures for General-Purpose Computing," *A.I. Technical Report No. 1586*, Oct. 1996, pp. i-353.

Dehon, A., "The Density Advantage of Configurable Computing," Apr. 2000, pp. 41-49, IEEE.

Dehon, A., "Transit Note #121: Notes on Programmable Interconnect," *M.I.T. Transit Project*, Feb. 1995, pp. 1-13.

Dehon, A., et al., "Design Patterns for Reconfigurable Computing," *Proceedings of the IEEE Symposium on Field-Programmable Custom Computing Machines*, Apr. 2004.

Dehon, A., et al., "DPGA-Coupled Microprocessors: Commodity ICs for the Early 21st Century," *FCCM '94-IEEE Workshop on FPGAs for Custom Computing Machines*, Apr. 1994, Napa Valley, California, USA.

Dehon, A., et al., "Reconfigurable Computing: What, Why, and Implications for Design Automation," *DAC 1999*, Jun. 1999, ACM, New Orleans, Louisiana.

Enzler, R., et al., "Virtualizing Hardware with Multi-Context Reconfigurable Arrays," *Lecture Notes in Computer Science*, Sep. 2003, pp. 151-160.

George, V., "Low Energy Field-Programmable Gate Array," *A Dissertation Submitted in Partial Satisfaction o the Requirements for the Degree of Doctor of Philosophy in Engineering-Electrical Engineering and Computer Sciences in the Graduate Division of the University of California, Berkeley*, Fall 2000 Month N/A, pp. 1-190.

Giraud-Carrier, C., "A Reconfigurable Data Flow Machine for Implementing Functional Programming Languages", *SIGPLAN Notices*, Sep. 1994, vol. 29 (9): 22-28.

Goldstein, S.C., et al., "PipeRench: A Coprocessor for Streaming Multimedia Acceleration", *In International Symposium on Computer Architecture (ISCA)*, pp. 28-39, May 1999.

Goldstein, S.C., et al., "PipeRench: A Reconfigurable Architecture and Compiler," Apr. 2000, pp. 70-77, IEEE.

Hauck, S., et al., "Montage: An FPGA for Synchronous and Asynchronous Circuits," *Field-Programmable Gate Arrays: Architectures and Tools for Rapid Prototyping*, 1993 Month N/A, Springer-Verlag, Berlin.

Heidari, G., et al., "Introducing a Paradigm Shift in the Design and Implementation of Wireless Devices," *A Wireless Devices Whitepaper*, Apr. 28, 2004 but © 2003, pp. 1-10, QuickSilver Technology, Inc., San Jose, California.

Hofstee, H.P., "Cell Broadband Engine Architecture from 20,000 Feet," Aug. 24, 2005, pp. 1-6.

Huang, A.S., "Tao: An Architecturally Balanced Reconfigurable Hardware Processor," *Submitted to the Dept. of Electrical Engineering and Computer Science in Partial Fulfillment of the Requirements for the Degrees of Bachelor of Science in Electrical Science and Engineering and Master of Engineering in Electrical Engineering and Computer Science at the Massachusetts Institute of Technology*, May 23, 1997, pp. 1-86, 107-109.

IBM, "Cell Broadband Engine Architecture, Version 1.0," Aug. 8, 2005, pp. 1-319, USA.

IBM, "SPU Application Binary Interface Specification, Version 1.3," *CBEA JSRE Series*, Aug. 1, 2005, pp. iv-26, USA.

IBM, "SPU Assembly Language Specification, Version 1.2," *CBEA JSRE Series*, Aug. 1, 2005, pp. iii-22, USA.

IBM, "SPU C/C++ Language Extensions, Version 2.0" *CBEA JSRE Series*, Aug. 1, 2005, pp. iv-84, USA.

IBM, "Synergistic Processor Unit Instruction Set Architecture, Version 1.0," Aug. 1, 2005, pp. 1-257, USA.

Kaviani, A., et al., "Computational Field Programmable Architecture," *Custom Integrated Circuits Conference*, 1998, Proceedings of the IEEE 1998, May 11-14, 1998.

Kaviani, A., et al., "Hybrid FPGA Architecture," *Proceedings of the 1996 ACM Fourth International Symposium on Field-Programmable Gate Arrays*, Feb. 11-13, 1996, 7 pages, Monterey, California, USA.

Keutzer, K., "Overview of *configurable* architectures," Feb. 28, 2002, slides 1-29.

Kocan, F., et al., "Logic Modules with Shared SRAM Tables for Field-Programmable Gate Arrays," *FPL 2004*, Aug./Sep. 2004, pp. 289-300, Springer-Verlag, Berlin Heidelberg.

Lehn, D.I., et al., "Evaluation of Rapid Context Switching on a CSRC Device," *Proceedings of the International Conference on Engineering of Reconfigurable Systems and Algorithms*, Jun. 24-27, 2002.

Lemieux, G., et al., "Generating Highly-Routable Sparse Crossbars for PLDs," *FPGA 2000*, Feb. 2000, ACM, Monterey, California, USA.

Lemieux, G., et al., "Using Sparse Crossbars within LUT Clusters," *FPGA 2001*, Feb. 11-13, 2001, ACM, Monterey, CA.

Lertora, F., et al., "Handling Different Computational Granularity by a Reconfigurable IC Featuring Embedded FPGAs and a Network-On-Chip," *13th Annual IEEE Symposium on Field-Programmable Custom Computing Machines (FCCM 2005) 2005*, Apr. 18-20, 2005.

Lewis, D., et al., "The Stratix-II Routing and Logic Architecture," *Proceedings of the 2005 ACM/SIGDA 13th International Symposium on Field-Programmable Gate Arrays*, pp. 1-22, Feb. 20-22, 2005, Monterey, California, USA.

Ling, A., "The Search for the Optimal FPGA Logic Block," 2001 Month N/A, ACM.

M2000, "FlexEOS Embedded FPGA Cores," 2003 Month N/A, M2000.

* cited by examiner

Typical sense amplifier

Modified Sense Amplifier

METHOD AND APPARATUS FOR ACCESSING CONTENTS OF MEMORY CELLS

CLAIM OF BENEFIT TO PRIOR APPLICATIONS

This application is a continuation application of U.S. patent application Ser. No. 11/081,870 filed Mar. 15, 2005, entitled "Method and Apparatus for Accessing Contents of Memory Cells", now issued as U.S. Pat. No. 7,230,869, which is incorporated herein by reference.

FIELD OF THE INVENTION

The invention relates to method and apparatus for accessing contents of memory cells.

BACKGROUND OF THE INVENTION

In recent years, there has been a proliferation of configurable integrated circuits (IC's). Configurable IC's include configurable circuits, such as configurable logic circuits and configurable interconnect circuits. A configurable circuit typically receives configuration data that "configures" the circuit to perform an operation in a set of operations that it can perform.

In a configurable IC, configuration data is typically stored in memory cells. These memory cells are often arranged in a shallow memory structure (such as one row of disjointed cells). In other words, deeper memory structures (e.g., memory arrays) are typically not used for the memory cells that store configuration data. This is because such memory cells need to continuously output configuration data that they store. However, it is difficult to wire memory cells inside a memory array with the lines that are needed for outputting the stored configuration data, because memory arrays are often already congested with word lines and bit lines for performing read and write operations.

Thus, there is a need in the art for a memory structure that will allow configuration data to be stored in memory arrays, which continuously output stored configuration data.

SUMMARY OF THE INVENTION

The invention relates to accessing contents of memory cells. Some embodiments include a memory structure that has a first cell, a second cell, and a sense amplifier. The first cell stores a first value. The first and second cells are connected to the sense amplifier by one or more bit lines. The sense amplifier receives the first value stored by the first cell by using the one or more bit lines and drives the received first value to the second cell through the one or more bit lines. The receiving and driving occur in a single clock cycle. In some embodiments, the second cell outputs the first value. The memory structure of some embodiments also includes a third cell connected to the sense amplifier by the one or more bit lines. The sense amplifier drives a second value to the third cell while the second cell outputs the first value. Other embodiments include a method for accessing data in a memory structure. The method receives a value stored by a first cell; and drives the received value to a second cell. The receiving and driving occur in a single time period. In some embodiments, the method also includes driving a first value to the second cell in a first time period and driving a second value to a third cell in a second time period. In these embodiments, the second cell outputs the first value during the second time period and the third cell outputs the second value during a third time period.

BRIEF DESCRIPTION OF THE DRAWINGS

The objects, features, and advantages of the invention will be apparent to one skilled in the art, in view of the following detailed description in which.

DETAILED DESCRIPTION OF THE INVENTION

The invention is directed towards method and apparatus for accessing contents of memory cells. In the following description, numerous details are set forth for purpose of explanation. However, one of ordinary skill in the art will realize that the invention may be practiced without the use of these specific details. For instance, the present invention is primarily described below with reference to memory cells that store configuration data. However, the same techniques can easily be applied for other types of memory circuits and/or for storage of other types of data. In other instances, well-known structures and devices are shown in block diagram form in order not to obscure the description of the invention with unnecessary detail.

I. Overview

Some embodiments of the invention provide a memory array for storing configuration data. The memory array includes sets of buffer cells and sets of non-buffer cells. The sets of non-buffer cells store configuration data sets. The buffer cells are used to provide continuous output of different configuration data sets that are stored in different non-buffer cells.

Specifically, to provide a continuous output of a particular configuration data set that is stored in a particular set of non-buffer cells, some embodiments transfer the contents of the particular set of non-buffer cells to a particular set of buffer cells. The particular buffer-cell set then provides a continuous output of the particular configuration data set, through a set of output lines that connect to the particular buffer cell set.

Some embodiments have multiple sets of buffer cells to allow the transfer of at least one configuration data set to be interleaved with the continuous output of at least one other configuration data set. For instance, some embodiments have two buffer cell sets, so that one buffer cell set continuously outputs a first configuration data set of a first non buffer cell set, while another buffer cell set receives a second configuration data set from a second non buffer cell set.

In some embodiments, each buffer cell set connects to a set of output lines that provide the continuous output of the content of the buffer cell set. Also, in some embodiments, the buffer cell sets are arranged along the periphery of the memory array. This arrangement simplifies the accessing of the buffer cells by the output lines that provide the continuous output of the configuration data sets that are stored in the buffer cells.

Figure 1:
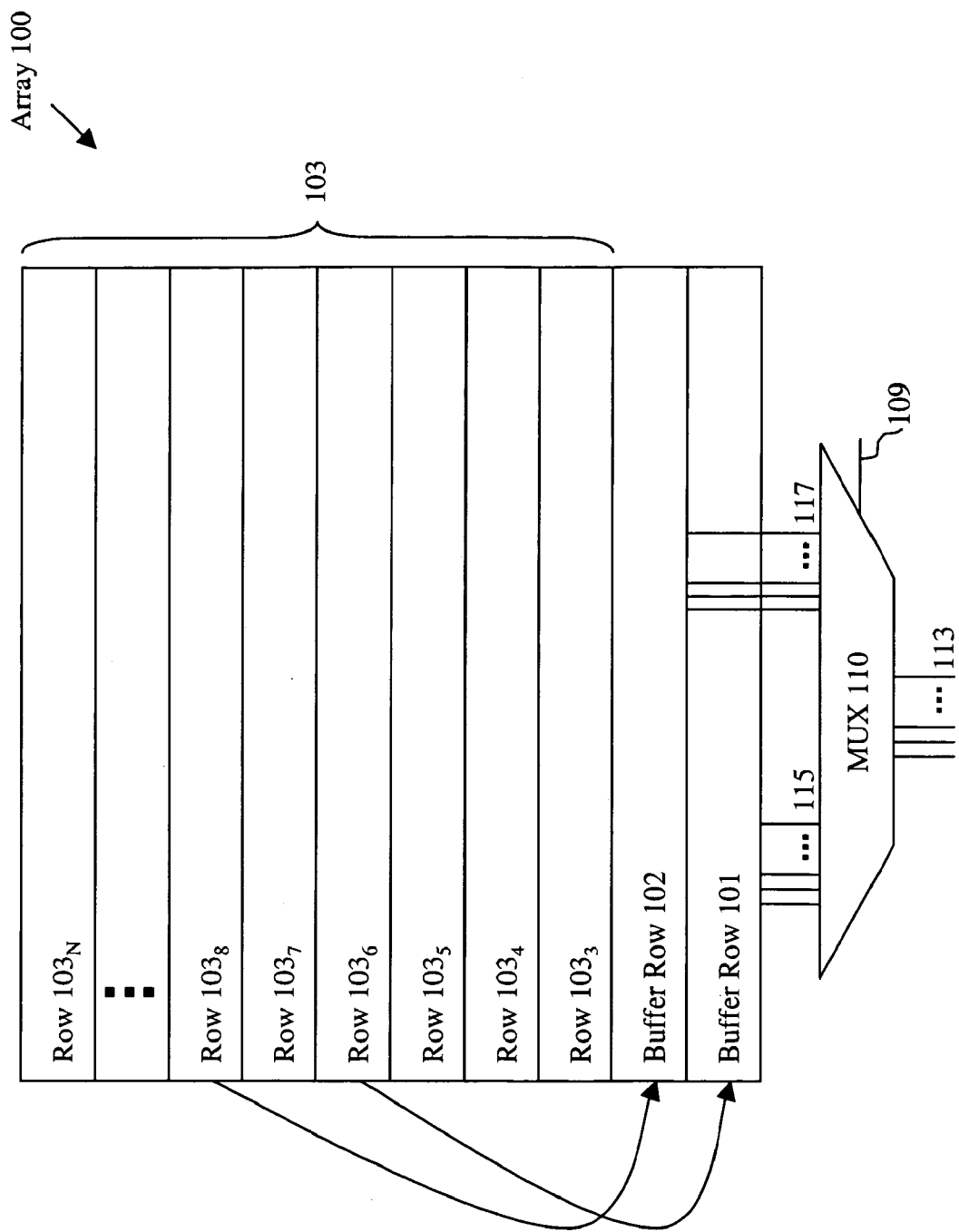
FIG. 1 illustrates an N row memory array.

FIG. 1 illustrates a more detailed embodiment of a memory array 100 of the invention. As shown in this figure, the memory array 100 includes N non-buffer rows $103_3$-$103_N$, two buffer rows 101 and 102, two sets of output lines 115 and 117 for the two buffer rows, a multiplexer 110, and configuration output lines 113.

The buffer and non-buffer rows are "logical" rows in the memory array. In some embodiments, each logical row is a separate physical row in the memory array. In other embodiments, two or more logical rows might occupy an actual physical row in the memory array, while one logical row might occupy more than one physical row in the memory array. However, the buffer rows are typically placed in one or more rows at or close to the periphery of the memory array.

Each non-buffer row stores a set of configuration data. To provide a continuous output of the particular configuration data set that is stored in a particular non-buffer row, the memory array shifts the particular configuration data set to a buffer row 101 or 102. Attached to each buffer row is a set of output lines 115 or 117, which provides a continuous output of the contents of the buffer row. Accordingly, through the output lines that are attached to the buffer row that receives the shifted configuration data set, the memory can provide a continuous output of the configuration data set.

The sets of output lines 115 and 117 are supplied to the multiplexer 110. The memory uses the multiplexer 110 in order to interleave the outputting of the configuration data sets from one buffer row with the shifting of the configuration data sets to the other buffer row. For instance, FIG. 1 illustrates that the configuration data set stored in non-buffer row $103_6$ is initially shifted to buffer row 101. Once shifted, the output lines 115 of the buffer row 101 provide a continuous output of the configuration data set received from the non-buffer row $103_6$. By designating the select signal on the select line 109 of the multiplexer 110, the multiplexer 110 can then be directed to connect the output of the buffer row 101 to the configuration output lines 113. As shown in FIG. 1, a configuration data set can be shifted from the non-buffer row $103_8$ to the buffer row 102, while the buffer row 101 outputs its configuration data set.

II. Implementation of Shifting Between Cells by Using Sense Amplifier

Different embodiments perform the shifting operation between non buffer rows and buffer rows differently. In some embodiments, shifting is accomplished through a modified sense amplifier that allows the reading and the writing of the contents of one cell in the memory array to another cell in the memory array to occur in a single cycle. Such a modified sense amplifier will be described by reference to FIGS. 2-4.

Figure 2:
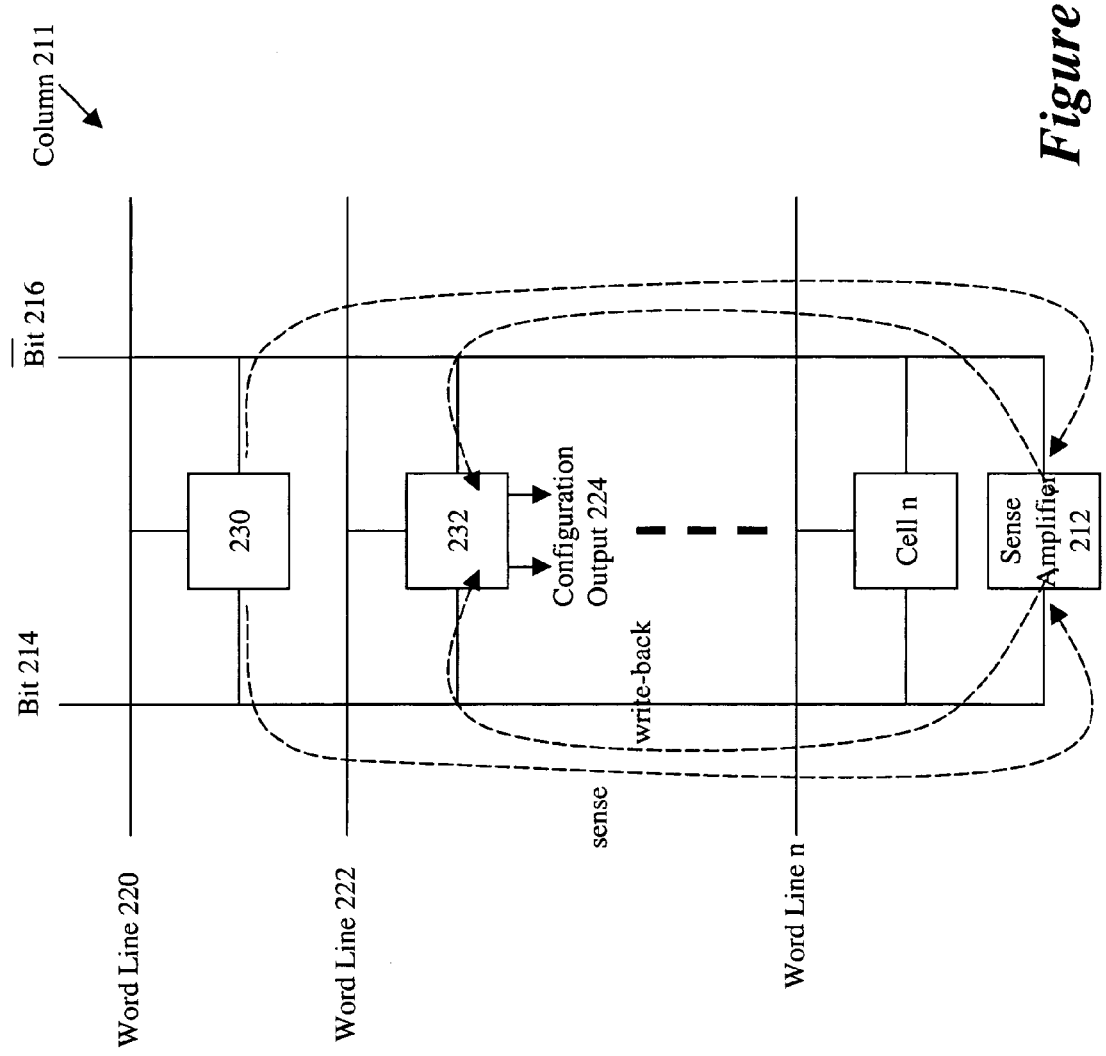
FIG. 2 illustrates one column of memory cells in a memory array.

FIG. 2 illustrates one column 211 of cells in the memory array 100 of FIG. 1.

Column 211 includes a bit line 214, a complement bit line 216, word lines 220 and 222, memory cells 230 and 232, and a sense amplifier 212. Memory cells in an array are typically arranged in columns and rows that are typically accessible through bit lines and word lines. For instance, the cell 230 is located between the bit lines 214 and 216 in the column 211, along the row of cells connected to the word line 220. The word line 220 enables write and/or read operations for the cell 230 by using the sense amplifier 212 tied to the bit lines 214 and 216.

As shown in FIG. 2, the column 211 includes the sense amplifier 212. This sense amplifier 212 allows for the shifting of the contents of one cell to another cell in the column 211 in a single cycle. For instance, during the first part of a given clock cycle, the word line 220 may be activated. When the word line 220 is activated, the sense amplifier 212 may sense a data value stored in the cell 230. Then, during a subsequent part of the same clock cycle, the word line 220 may be de-activated and the word line 222 may be activated instead. When the word line 222 is activated, the sense amplifier 212 may write that last sensed data value (from the cell 230) back along the bit lines 214 and 216 to another cell 232 in the column 211, all in the same clock cycle. As shown in FIG. 2, the cell 232 may be a buffer cell that is wired with output lines 224.

III. Sense Amplifiers Known in the Art Incapable of Shifting

Figure 3:
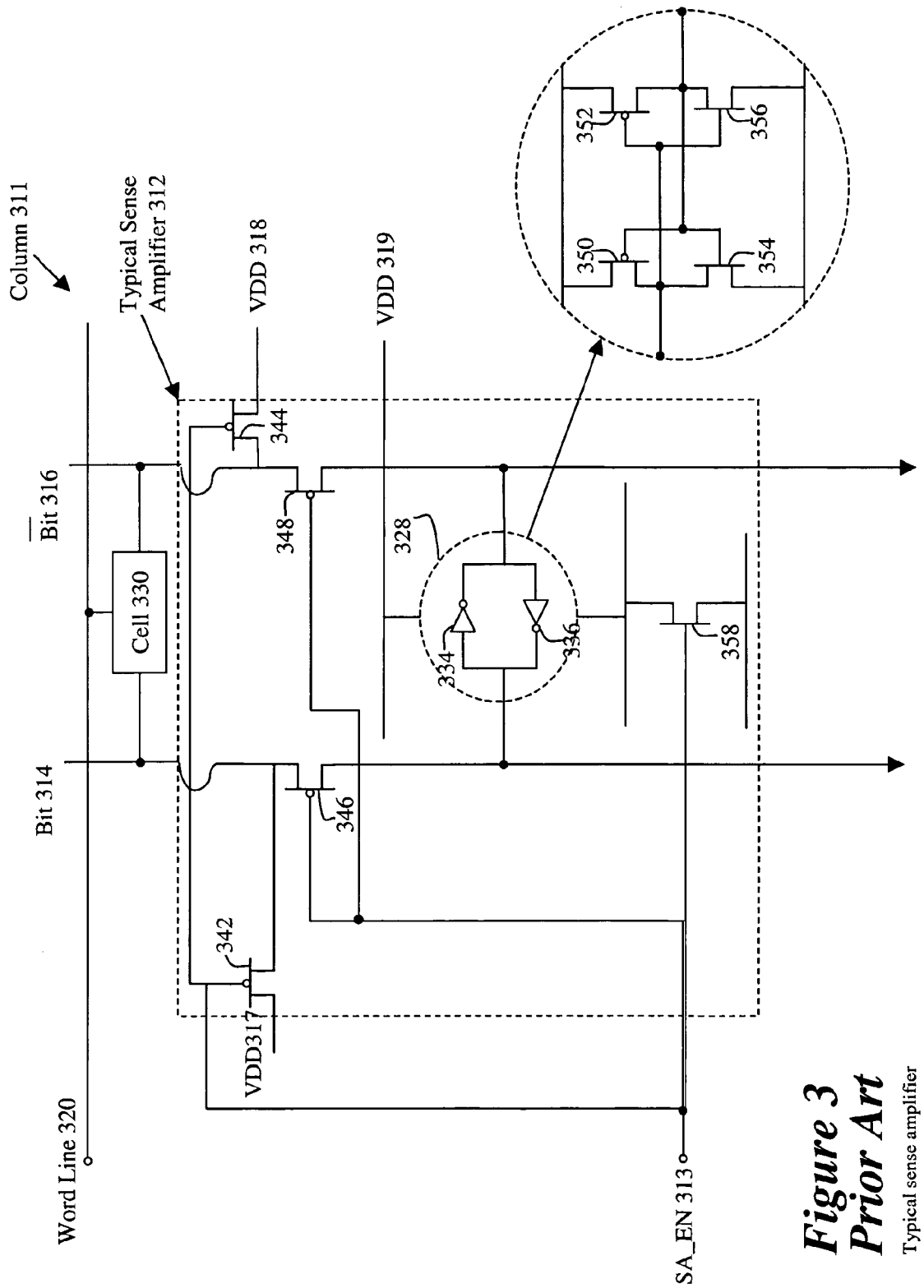
FIG. 3 illustrates a diagram of a typical sense amplifier for one column of memory cells in a memory array, as is known in the art.

The sense amplifiers known in the art do not allow reading and writing in the same cycle. For instance, FIG. 3 illustrates a diagram of one column 311 of memory cells in a memory array that is known in the art. Each cell in the column 311 can be either written to, or read from, in a given cycle. However, to move the contents from one cell to another cell in the column 311, the typical sense amplifier 312 requires multiple cycles (i.e., separate read and write cycles) and external hardware such as an external register for temporary data storage external to the memory array.

As shown in FIG. 3, the typical sense amplifier 312 includes pass gates 342 and 344, read isolation gates 346 and 348, an enable_gate 358, an amplifier stage 328, a sense_amplifier_enable line (SA_EN) 313, and input voltage (VDD) lines 317, 318, and 319.

The sense_amplifier_enable line 313 is coupled to the gate-inputs of the pass gates 342 and 344, the gate-inputs of the read isolation gates 346 and 348, and the gate-input of the enable_gate 358. During a read or write operation, the sense_amplifier_enable line 313 enables the sense amplifier 312 by activating the pass gates 342 and 344, and the read isolation gates 346 and 348, to provide signal and power to the amplifier stage 328, through the bit lines 314 and 316.

The amplifier stage 328 is coupled to the VDD line 319, to the enable_gate 358, and to the bit lines 314 and 316. As shown in FIG. 3, the amplifier stage 328 is typically a pair of cross-coupled CMOS inverters 334 and 336 that are formed by two PMOS transistors 350 and 352, and two NMOS transistors 354 and 356. During a read operation, the amplifier stage 328 senses a value stored in the cell 330 through the bit lines 314 and 316. The amplifier stage 328 then amplifies the sensed value by using power from the input VDD line 319.

The following will describe a read operation of the contents of the cell 330 by using the typical sense amplifier 312. During a read operation, the voltage on the bit lines 314 and 316 are pre-charged to a pre-determined level. Also during a read operation, the read isolation gates 346 and 348 are turned on using the sense_amplifier_enable line 313. When the read isolation gates 346 and 348 are turned on, a cell with an activated word line will modify the pre-charged voltages on the bit lines 314 and 316. In this manner, the cell will pass its contents in the form of voltages along the bit lines 314 and 316, through the read isolation gates 346 and 348, into the amplifier stage 328. For instance, if the word line 320 is activated then the contents of the cell 330 will be "sensed" by the amplifier stage 328 of the sense amplifier 312. The amplifier stage 328 then pushes the values read from the cell 330 to the rails by using the power supplied by the VDD line 319.

Within the same clock cycle, the read isolation gates 346 and 348 are typically then turned off (after sensing) to prevent the amplifier stage 328 from undesirably altering the contents of the memory cells in column 311. However, the VDD line 319 continues to provide power to the amplifier stage 328.

Thus, the sensed and amplified values in the amplifier stage 328 will be pushed onto the bit lines 314 and 316 for reading at a location that is external to the column 311 and the memory array 300.

In order to copy the contents of one cell to another cell in a memory array, previously the art required the read operation described above in addition to a separate write operation from an external storage location. The external location is typically a register or other temporary means to hold the contents of a first cell in the array until these contents can be written in a subsequent cycle to a second cell in the memory array. Accordingly, reading and writing back the contents of memory cells in this manner known in the art typically requires multiple clock cycles and external components such as a register.

IV. Modified Sense Amplifier

Some embodiments of the invention save clock cycle time and reduce hardware requirements over the art by shifting the contents of one cell to another cell in a single clock cycle without the need for an external temporary storage location. These embodiments will now be described in relation to FIG. 4.

Figure 4:
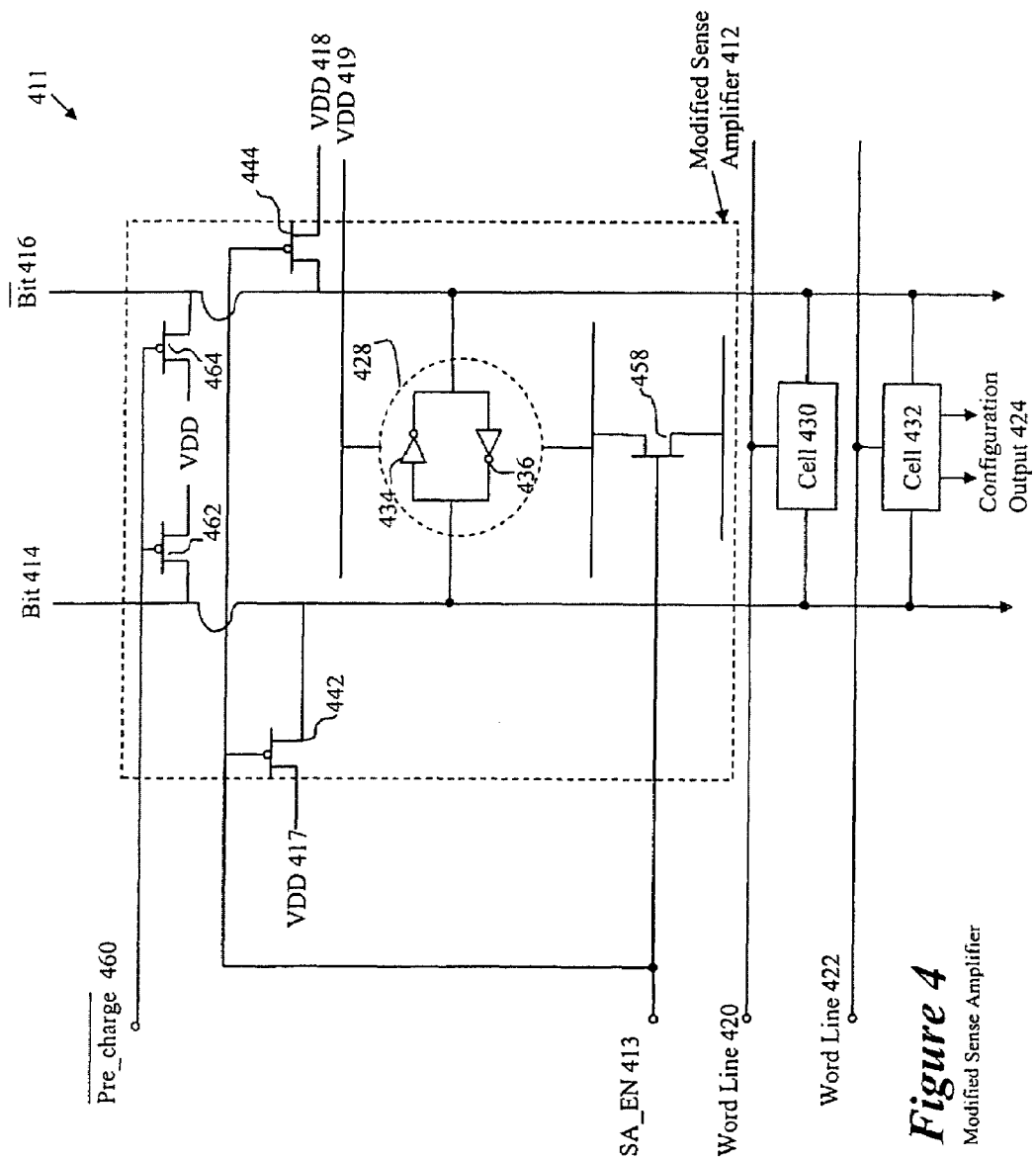
FIG. 4 illustrates a modified sense amplifier for one column of memory cells in a memory array, according to some embodiments of the invention.

FIG. 4 illustrates a column 411 of cells. The column 411 includes a non-buffer cell 430, a buffer cell 432, and a modified sense amplifier 412, all coupled between a bit line 414 and a complement-bit line 416. The non-buffer cell 430 represents a cell in the non-buffer rows $103_3$-$103_8$ illustrated in FIG. 1, while the buffer cell 432 represents a buffer cell in the buffer rows 101-102 illustrated in FIG. 1. The non-buffer cell 430 is tied to the word line 420 while the buffer cell 432 is tied to the word line 422, to enable read and write operations for these cells.

FIG. 4 also illustrates the modified sense amplifier 412, according to some embodiments of the invention. The modified sense amplifier 412 is similar to the typical sense amplifier 312 illustrated in FIG. 3, in that it provides read and write operations for buffer and non-buffer cells in the column 411. However, the modified sense amplifier 412 differs from the typical sense amplifier 312 in that it does not include the read isolation gates 346 and 348. As previously mentioned, the read isolation gates 346 and 348 isolate the typical sense amplifier 312 after the sensing stage of a read operation to prevent unintended write back to the cells in the column 311 illustrated in FIG. 3.

In contrast, the modified sense amplifier 412 shown in FIG. 4 allows the bit lines to be driven high (back up to the rails) after the sensing stage of a read operation. The modified sense amplifier 412 of the illustrated embodiment then uses the bit lines to write the contents of a first cell (the cell that was read) to a second cell, in the same cycle as the read operation for the first cell.

To perform the foregoing, the modified sense amplifier 412 further includes a precharge-bar line 460 coupled to pre-charge transistors 462 and 464. The precharge transistors 462 and 464 can be PMOS transistors and can be used to supply faster charging to the bit lines 414 and 416. Rapid charging of the bit lines may be desired, for example, in order to execute both a read and write operation in the same clock cycle. An example where the modified sense amplifier 412 both reads from the cell 430 and writes to the cell 432 (a "shifting" operation) will now be described.

As previously mentioned for a typical read operation, both bit lines are driven to a predetermined level and then subsequently allowed to graduate toward a value stored in a cell with an activated word line. For instance, after initial pre-charging, the bit line 414 can be pulled high and the complement bit line 416 can be pulled low by the value stored in the cell 430. The precharge-bar line 460 may be used to drive the initial values on these bit lines 414 and 416. The word line 420 can be activated to allow the value of the cell 430 to be sensed and amplified by the amplifier stage 428 through the bit lines 414 and 416. Once the value in the cell 430 is sensed by the amplifier stage 428, the word line 420 and the precharge-bar line 460 can be de-activated.

However, since the modified sense amplifier 412 has no read isolation gates, the value sensed from the cell 430 at the amplifier stage 428 can be driven back along the bit lines 414 and 416 to the memory cells in the column 411. This feedback signal along the bit lines 414 and 416 is similar to the write signal during a typical write operation, where both bit lines are driven high, then one bit line is brought low to write the value on the bit lines into the cell with the activated word line. The word line 422 can be activated to write into the cell 432 the value previously sensed by the amplifier stage 428 (through the bit lines 414 and 416). Moreover, since the buffer cell 432 is wired with the configuration output 424, the shifted contents of the non-buffer cell 430 are immediately available at the configuration output 424 of the buffer cell 432.

V. Shifting Can Be Performed for Entire Rows of Cells

The process described above can be repeated across all the cells coupled to a given word line to shift an entire first row of cells in a memory array to a second row of cells in the array. The first row can be a non-buffer row such as rows $103_3$-$103_8$ in FIG. 1. The second row can be a buffer row such as rows 101-102 in FIG. 1.

Figure 5:
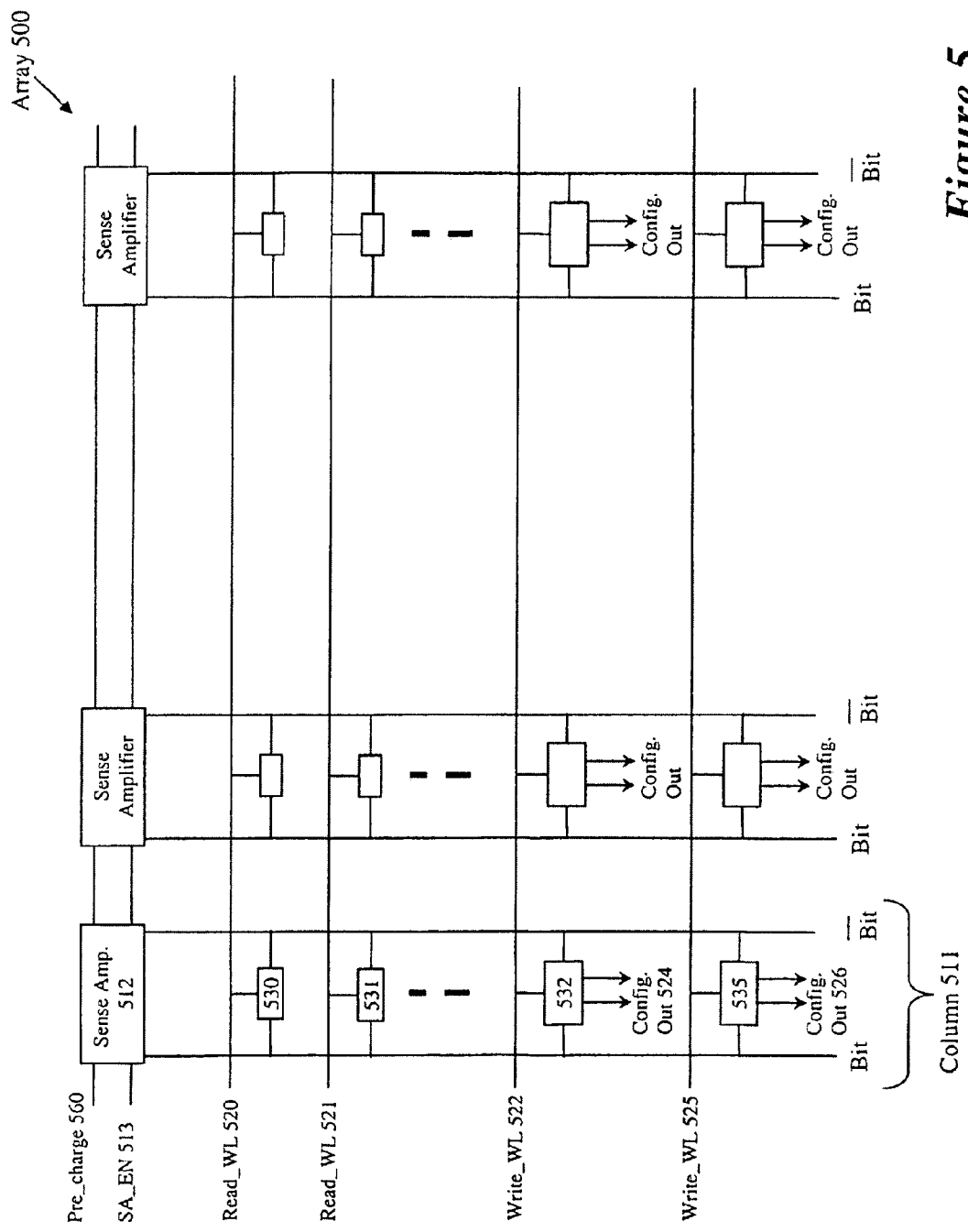
FIG. 5 illustrates several sense amplifiers for several columns of memory cells in a memory array, according to some embodiments of the invention.

For instance, FIG. 5 illustrates several sense amplifiers for several columns of cells in a memory array 500, according to some embodiments of the invention. The memory array 500 includes a precharge line 560, a sense_amplifier enable line (SA_EN) 513, read_word lines (Read_WL) 520 and 521 write_word lines (Write_WL) 522 and 525, and a cell column 511. The column 511 includes non-buffer cells 530 and 531, and buffer cells 532 and 535. This column 511 illustrates a more detailed embodiment of the column 211 in FIG. 2, and the array 500 illustrates a more detailed embodiment of the array 100 in FIG. 1.

As shown in FIG. 5, the contents of each cell in a first row in the array 500 can be shifted to the cells in a second row in the array 500 by using the method described in relation to FIG. 4. For instance, the read_word line 520 connects a non-buffer cell in each column of the memory array 500, to form a non-buffer row of memory cells in the array 500, while the write_word line 522 connects a buffer cell in each column of the memory array 500, to form a buffer row of cells in the array 500. The read_word line 520 and the write_word line 522 can each be activated in sequence within the same cycle such that the contents of the non-buffer row coupled to the read_word line 520 can be read in a first part of a cycle and written to the buffer row coupled to the write_word line 522, in a second part of the same cycle. The memory array 500 performs this shifting of the contents of the cells in each row by using the modified sense amplifier 512 of some embodiments, as previously described in relation to FIG. 4.

The buffer row cells of some embodiments, such as the buffer cells 532 and 535 in FIG. 5, are wired with configuration output lines to allow their contents to be outputted from the memory array 500, without the need for a read operation. Shifting to and outputting by the separate buffer rows containing the buffer cells 532 and 535, respectively, can be interleaved such that the contents of any given row is outputted by one of the buffer rows in any given cycle. The operation of the memory array 500 will be further described in relation to the timing diagram illustrated in FIG. 6.

VI. Timing Diagram for Interleaved Shifting of Rows

Figure 6:
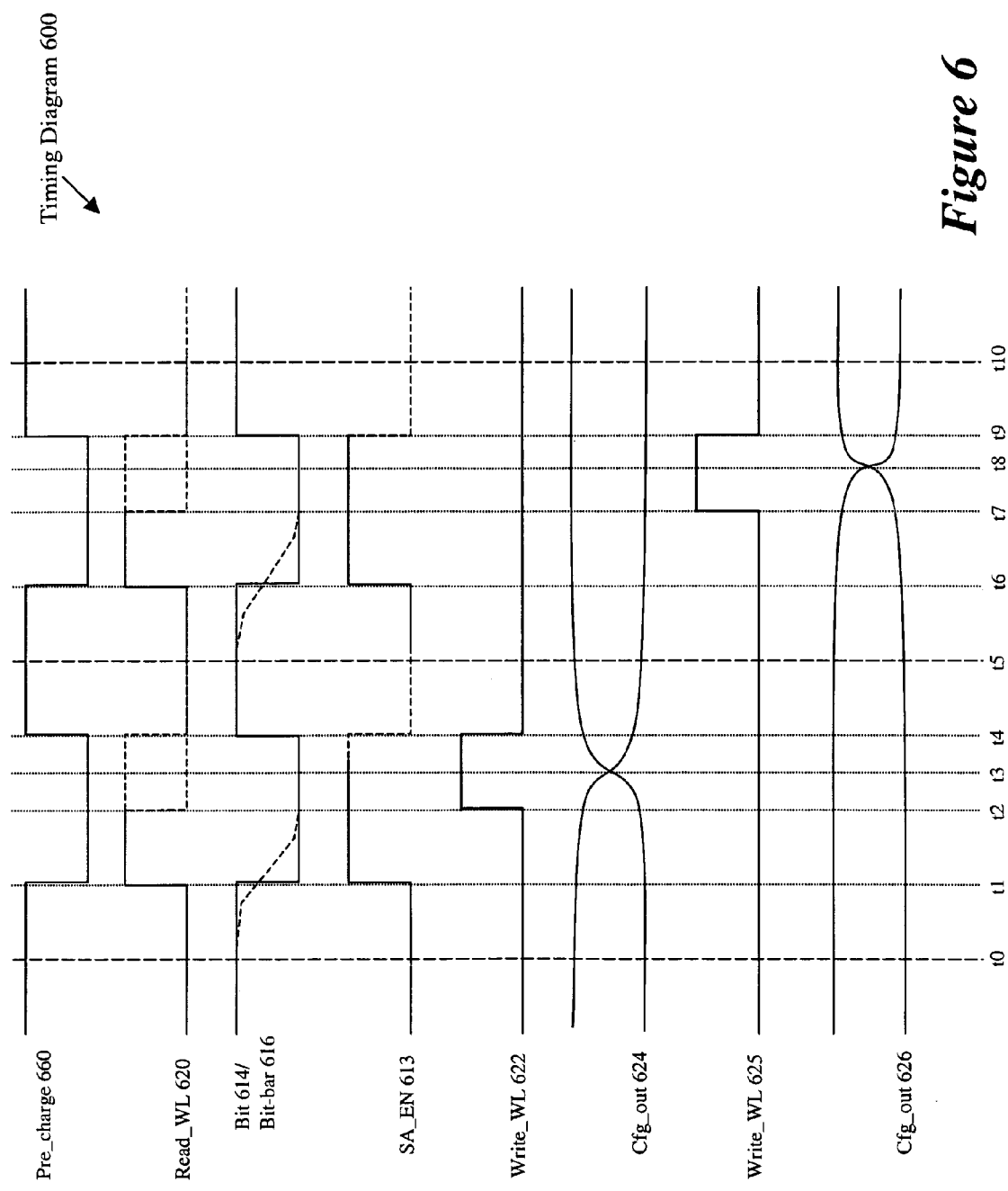
FIG. 6 illustrates a timing diagram according to some embodiments of the invention.

FIG. 6 illustrates a timing diagram 600 according to some embodiments of the invention. The timing diagram 600 includes a pre-charge signal 660, a read_word_line signal (Read_WL) 620, bit signals 614 and 616, a sense_amplifier_enable signal (SA_EN) 613, write_word_line signals (Write_WL) 622 and 625, and configuration_output signals (Cfg_out) 624 and 626.

The pre-charge signal 660 represents the signal through the pre-charge line 560 in FIG. 5. The pre-charge signal 660 allows the bit signals 614 and 616 to be quickly charged, for instance, prior to a read or a write operation.

The read_word_line signal 620 represents the signal through the word line 520 in FIG. 5. The read_word_line signal 620 allows read access to the cells in a row coupled to the word line 520.

The bit signals 614 and 616 represent the signals through the bit lines 514 and 516 in FIG. 5. The bit signals 614 and 616 provide a differential signal for the cells in a column of a memory array and for a sense amplifier coupled to the cells in the column of the memory array.

The sense_amplifier_enable signal (SA_EN) 613 represents the signal through the sense_amplifier_enable line 513 in FIG. 5. The sense_amplifier_enable signal 613 enables the sense amplifier 512 for a read or write operation to, or from, the cells that are coupled to the sense amplifier 512 by the bit lines 514 and 516.

The write_word_line signal (Write_WL) 622 represents a signal through the word line 522 in FIG. 5. The write_word_line signal 622 enables a write operation for the row of cells that are coupled to the word line 522.

The configuration_output signal (Cfg_out) 624 represents a signal through the configuration_output lines 524 in FIG. 5. The configuration_output signal 624 can provide the value stored in the buffer cell 532 (i.e., the "configuration" of the buffer cell 532) to a location outside of the memory array 500.

The write_word_line signal (Write_WL) 625 represents a signal through the word line 525 in FIG. 5. The write_word_line signal 625 enables a write operation for the row of cells that are coupled to the word line 525.

The configuration_output signal (Cfg_out) 626 represents a signal through the configuration_output lines 526 in FIG. 5. The configuration_output signal 626 can provide the value stored in the buffer cell 535 (the "configuration" of the buffer cell 535) to a location outside of the memory array 500.

FIG. 6 further illustrates two clock cycles. In the first clock cycle, indicated by the times t0 to t5, the contents of the non-buffer cell 530 are shifted to the buffer cell 532 in FIG. 5. In the second clock cycle, indicated by the times t5 to t10, the contents of the non-buffer cell 530 are shifted to the buffer cell 535. The following describes the state of each signal shown in FIG. 6 in relation to FIG. 5 during each shifting operation.

As shown in FIG. 6, at time t0 the pre-charge signal 660 and the bit signals 614 and 616, are driven high (have a logical "1") in preparation of a read/write operation. Also at t0, the read_word_line signal 620, the sense_amplifier_enable signal 613, and the write_word_line signals 622 and 625 are low (have a logical "0"). Further at t0, the configuration_output signals 624 and 626 each have one high and one low output at their pairs of output lines 524 and 526.

At t1, the precharge signal 660 is brought low and one of the bit signals 614 and 616 is subsequently pulled lower by the stored voltage that, in some embodiments, represents the contents of the cell 530. In other embodiments, one of the bit signals 614 and 616 is pulled lower by the stored voltage that represents the complement value stored by the cell 530. Also at t1, the read_word_line signal 620 and the sense_amplifier_enable signal 613 are driven high (are "enabled"). The foregoing allows the value in the cell 530 to be read or "sensed" by the sense amplifier 512 through the bit lines 514 and 516 in FIG. 5.

At t2, the read_word_line signal 620 is brought low and the write_word_line signal 622 is driven high. This allows the value "sensed" by the sense amplifier 512 at t1 to be written (or "shifted") to the cell 532 shown in FIG. 5. As shown by dashed lines in FIG. 6, previously in the art, the read_word_line signal 620 was driven high for much of the clock cycle from t0 to t5. However, in the described embodiment, the read_word_line signal 620 is driven high for less than the duration of a clock cycle in order to share the clock cycle from t0 to t5 with the write_word_line signal 622.

At t3, while the write_word_line signal 622 is high, the pair of configuration_output signals 624 reverse their values to represent that the contents of the buffer cell 532 have been over-written by the sense amplifier 512 and that the configuration_output lines 524 are now outputting the new value and its complement from the buffer cell 532.

At t4, the precharge signal 660 and the bit signals 614 and 616 are driven high again in preparation of another read/write operation. The sense_amplifier_enable signal 613 and the write_word_line signal 622 are brought low to disable sensing by the sense amplifier 512 and to disable writing to the cell 532, respectively.

At t5, the first clock cycle ends and the second clock cycle begins. The sequence repeats to shift the contents of the non-buffer cell 530 into the buffer cell 535. Thus at t6, the contents of the non-buffer cell 530 are sensed by the sense amplifier 512. At t7, the sensed values are written to the buffer cell 535. At t8, the configuration_output signal 626 reflects the changed contents of the buffer cell 535. At t9, the pre-charging of the bit lines 514 and 516, represented by the precharge signal 660, resumes in preparation of the next read/write operation. The second cycle concludes at t10, where a third cycle may commence. Sensing (and thus shifting) from the same source cell 530 is illustrated for both the first and second clock cycles to simplify the timing diagram 500. However, one of ordinary skill will recognize that FIG. 5 is representative. Thus, shifting from a source cell other than the cell 530 can occur in either the first or second clock cycle shown in FIG. 5.

VII. Advantages

Shifting

The present invention provides several advantages over the prior art. For instance, the present invention allows shifting of data between cells in a memory array in a single clock cycle. Shifting can occur for all of the cells in a non-buffer row to a buffer row of cells. Given multiple buffer rows, shifting to the multiple buffer rows can be time multiplexed (interleaved) such that the contents of a different non-buffer row can be shifted to a buffer row in every cycle. Thus, the contents of a different row of cells is available at one of the buffer rows at every cycle.

Read-Modify-Write Cycles

A normal modify memory operation requires reading out to a register, modifying the contents of the register, and then writing back to the memory location. Here, the contents of a cell and row of cells could be modified in a single cycle completely within memory. For instance, a bit-mask could be applied to the contents of the source row before the contents are written back to a destination row. Further, if the destination row is a buffer row, then those modified contents would be available immediately at the configuration outputs of that buffer row.

Peripheral Rows

Several rows of the memory array can be designated as buffer rows and wired out for outputting the data contained in these rows. In some embodiments these rows are near the periphery of the memory array. Reading (outputting) from one peripheral row to the output lines and shifting to another peripheral row can occur in the same clock cycle. Since outputting and shifting is effectively time multiplexed across multiple buffer rows, the contents of an entire memory array can be outputted rapidly in succession. Moreover, the memory array is no longer limited in depth because the present invention eliminates the need to wire the internal nodes of the array with additional output lines.

The foregoing has described method and apparatus for accessing contents of memory cells. One of ordinary skill will also recognize that the invention can be embodied in other specific forms without departing from the spirit of the invention, even though the invention has been described with reference to numerous specific details. In view of the foregoing, one of ordinary skill in the art would understand that the invention is not to be limited by the foregoing illustrative details, but rather is to be defined by the appended claims.

What is claimed is:

1. A method for accessing data in a memory structure, said method comprising:
   receiving a value stored by a first cell;
   driving said received value to a second cell; and
   from the second cell, continuously outputting said value without requiring a read operation,
   wherein said first and second cells are part of a set of cells arranged in a contiguous array of cells,
   wherein a third cell is located between said first and second cells.

2. The method of claim 1, wherein said receiving and driving occur in a time period that is not greater than a clock cycle.

3. The method of claim 1, wherein said array includes a plurality of rows and columns, said first and second cells are in one column.

4. The method of claim 1, wherein said value is configuration data and the memory structure is a memory used in a configurable integrated circuit having a plurality of configurable circuits that operate based on the configuration data.

5. A memory structure comprising:
   a plurality of cells arranged in rows and columns; and
   first, second, and third cells arranged in a particular column,
   wherein the third cell is for (i) receiving and storing data from the first cell during a first time period, (ii) receiving and storing data from the second cell during a second time period, and (iii) continuously outputting each stored data without requiring a read operation.

6. The memory structure of claim 5, wherein the data that is continuously outputted by the third cell is configuration data.

7. An integrated circuit (IC) comprising:
   a plurality of configurable circuits for configurably performing a number of operations based on configuration data; and
   a memory structure comprising:
      a memory array comprising a plurality of cells arranged in rows and columns; and
      a first cell and a second cell arranged in a particular column, the first cell for storing and outputting configuration data,
      wherein the second cell is for (i) receiving said configuration data from said first cell and (ii) continuously outputting said received configuration data without requiring a read operation.

8. The IC of claim 7, wherein said second cell is on a periphery of the memory array.

9. The IC of claim 7, wherein said second cell is a buffer that continuously outputs data for the entire duration that said cell stores said data.

10. The IC of claim 7, wherein at least one of said plurality of configurable circuits is for receiving the configuration data output by the second cell.

* * * * *